United States Patent [19]
Kim

[11] Patent Number: 5,638,023
[45] Date of Patent: Jun. 10, 1997

[54] CHARGE PUMP CIRCUIT

[75] Inventor: Man-Seung Kim, Choongchungbook-do, Rep. of Korea

[73] Assignee: LG Semicon Co. Ltd., Cheongju, Rep. of Korea

[21] Appl. No.: 457,713

[22] Filed: Jun. 1, 1995

[30] Foreign Application Priority Data

Jul. 30, 1994 [KR] Rep. of Korea ................ 18921/1994

[51] Int. Cl.$^6$ ........................................................ G05F 1/10
[52] U.S. Cl. ............................ 327/589; 327/536; 327/537
[58] Field of Search ................................. 327/536, 537, 327/535, 538, 543, 589

[56] References Cited

U.S. PATENT DOCUMENTS

| | | | |
|---|---|---|---|
| 4,223,238 | 9/1980 | Parkinson et al. | 307/297 |
| 4,570,088 | 2/1986 | Nozaki et al. | 307/481 |
| 4,633,106 | 12/1986 | Backes et al. | |
| 4,673,829 | 6/1987 | Gupta. | |
| 4,876,462 | 10/1989 | Kobatake et al. | 307/578 |
| 4,905,314 | 2/1990 | Kato et al. | 327/589 |
| 4,920,280 | 4/1990 | Cho et al. | 327/537 |
| 5,041,739 | 8/1991 | Goto | 307/296.2 |
| 5,212,456 | 5/1993 | Kovalcik et al. | 330/261 |
| 5,239,455 | 8/1993 | Fobbester et al. | 363/60 |
| 5,258,662 | 11/1993 | Skovmand | 307/296.3 |
| 5,315,188 | 5/1994 | Lee | 327/536 |
| 5,343,088 | 8/1994 | Jeon | 327/537 |

Primary Examiner—Timothy P. Callahan
Assistant Examiner—Jung Ho Kim
Attorney, Agent, or Firm—Fleshner & Kim

[57] ABSTRACT

An improved charge pump circuit prevents excessive current leakage. A first MOS transistor has a drain terminal to receive an external voltage and a gate terminal which receives a word line voltage. The first MOS transistor drops the word line voltage by a threshold voltage and transfers the dropped voltage to a source terminal thereof. A capacitor generates a desired voltage for each rising edge of clock pulses applied thereto, and a second MOS transistor has a gate terminal receiving the word line voltage and a drain terminal receiving the voltage from the capacitor. The second MOS transistor transfers the voltage from the capacitor through a source terminal thereof with substantially no voltage drop. A third MOS transistor has a gate terminal connected to the source terminal of the first MOS transistor and a drain terminal connected in common to the source terminals of the first and second MOS transistors. The third MOS transistor adds an output voltage from the source terminal of the second MOS transistor to an output voltage from the source terminal of the first MOS transistor and transfers the added voltage through a source terminal thereof to the word line and the gate terminal of the first MOS transistor.

7 Claims, 2 Drawing Sheets

CHARGE PUMP CIRCUIT

BACKGROUND OF THE INVENTION

1. Field of the Invention

The present invention relates in general to charge pump circuits for memory devices, and more particularly to a charge pump circuit for avoiding excessive current which may be generated instantaneously upon application of a supply voltage at an initial operating state, to reduce power consumption and increase reliability in operation.

2. Description of the Prior Art

Generally, a supply voltage is boosted to a desired level to drive memory cells in a memory device. However, the boosted voltage may be dropped due to charge leakage or other conditions. The dropped voltage must be restored to its original level to drive the memory cells accurately. It is common to use a charge pump circuit to restore the dropped voltage to the original level.

Referring to FIG. 1, there is shown a circuit diagram of a conventional charge pump circuit. As shown in this drawing, the conventional charge pump circuit comprises first and second MOS transistors M1 and M2. The first MOS transistor M1 has a gate terminal connected to a word line W/L, a source terminal connected in common to gate and drain terminals of the second MOS transistor M2, and a drain terminal connected to an output terminal Vpp of a pulse generator (not shown) which boosts a supply voltage to a desired level to drive memory cells in a memory device. The second MOS transistor M2 has a source terminal connected in common to the gate terminal of the first MOS transistor M1 and the word line W/L. The drain terminal of the second MOS transistor M2 is also connected to one side of a capacitor C1, the other side of which is supplied with external clock pulses $\phi$.

The operation of the conventional charge pump circuit with the above-mentioned construction will hereinafter be described with reference to FIG. 1.

When the supply voltage of, for example, 5 V is applied to the memory device to drive the memory cells therein, it is boosted to 15 V (Vpp) by the pulse generator (not shown) of the memory device. The boosted voltage from the pulse generator is applied to the drain terminal of the first MOS transistor M1 in the charge pump circuit. A word line voltage of 5 V is applied to the gate terminal of the first MOS transistor M1, thereby causing the first MOS transistor M1 to be turned on.

As the first MOS transistor M1 is turned on, the word line voltage of 5 V at the gate terminal of the first MOS transistor M1 is transferred to the source terminal thereof, while being dropped by a threshold voltage $V_T$ of the first MOS transistor M1. The resultant voltage (5 V–$V_T$) at the source terminal of the first MOS transistor M1 is transferred to a node A. Because the node A is connected in common to the gate and drain terminals of the second MOS transistor M2, the voltage (5 V–$V_T$) thereof is transferred directly to a node B between the drain terminal of the second MOS transistor M2 and the capacitor C1.

Upon receiving the external clock pulse $\phi$, the capacitor C1 performs a charging operation to generate a voltage $\Delta V$ at a rising edge of the clock pulse $\phi$. The voltage $\Delta V$ generated from the capacitor C1 is added to the voltage (5 V–$V_T$) at the node B, so that the voltage at the node B is boosted to a level (5 V–$V_T$+$\Delta V$). The boosted voltage (5 V–$V_T$+$\Delta V$) at the node B is transferred to the gate terminal of the first MOS transistor M1 and the word line W/L through the source terminal of the turned-on second MOS transistor M2. As a result, the boosted voltage (5 V–$V_T$+$\Delta V$) appears at the source terminal of the first MOS transistor M1. Namely, the previous voltage (5 V–$V_T$) at the source terminal of the first MOS transistor M1 is boosted by $\Delta V$. The boosted voltage (5 V–$V_T$+$\Delta V$) at the source terminal of the first MOS transistor M1 is again transferred to the nodes A and B. In succession, the voltage $\Delta V$ is generated from the capacitor C1 at a rising edge of the subsequent clock pulse $\phi$ and added to the voltage (5 V–$V_T$+$\Delta V$) transferred to the node B. The resultant voltage at the node B is applied to the gate terminal of the first MOS transistor M1 through the source terminal of the second MOS transistor M2. At that time the voltage at the node A is boosted to 15 V for the last time with the above operation continuously repeated, it is transferred to the word line W/L to drive the memory cells in the memory device.

Noticeably, if a voltage appearing at the drain terminal of the second MOS transistor M2 is 5 V–$V_T$+$\Delta V$, a voltage appearing at the source terminal thereof must be 5 V–$V_T$+$\Delta V$–$V_{T2}$, where $V_{T2}$ is a threshold voltage of the second MOS transistor M2, which results from the voltage at the drain terminal of the second MOS transistor M2 being dropped by the threshold voltage $V_{T2}$ thereof. In practice, because the threshold voltage $V_{T2}$ of the second MOS transistor M2 is set to "0", the voltage (5 V–$V_T$+$\Delta V$) at the drain terminal of the second MOS transistor M2 appears directly at the source terminal thereof. Since the voltage (5 V–$V_T$+$\Delta V$) must be boosted to 15 V, the voltage $\Delta V$ generated from the capacitor C1 and the threshold voltage $V_T$ of the first MOS transistor M1 have the following relationship therebetween:

$$V_T < \Delta V$$

However, the above-mentioned conventional charge pump circuit has a disadvantage in that a large amount of current flows instantaneously through the node B between the capacitor C1 and the drain terminal of the second MOS transistor M2 when the clock pulse $\phi$ is presented to the capacitor C1 as the supply voltage is applied. The instantaneous, excessive current results in unnecessary power consumption and, particularly, latch-up in CMOS transistors.

SUMMARY OF THE INVENTION

Therefore, the present invention has been made in view of the above problem, and it is an object of the present invention to provide a charge pump circuit for avoiding excessive current which may be generated instantaneously upon application of a supply voltage at an initial operating state, to reduce power consumption and increase reliability in operation.

In accordance with the present invention, the above and other objects can be accomplished by a provision of a charge pump circuit comprising a capacitor and first to third MOS transistors. The first MOS transistor has a drain terminal for inputting an external voltage and a gate terminal for inputting a word line voltage. The first MOS transistor drops the word line voltage by a threshold voltage thereof within the range of the external voltage and transfers the dropped voltage through a source terminal thereof. The capacitor generates a desired voltage for each rising edge of clock pulses applied thereto. The second MOS transistor has a gate terminal for inputting the word line voltage and a drain terminal for inputting the voltage from the capacitor. The second MOS transistor transfers the voltage from the capacitor through a source terminal thereof with no voltage drop. The third MOS transistor has a gate terminal connected to the source terminal of the first MOS transistor and a drain terminal connected in common to the source terminals of the first and second MOS transistors. The third MOS transistor adds an output voltage from the source terminal of the second MOS transistor to an output voltage from the source terminal of the first MOS transistor and transfers the added voltage through a source terminal thereof to a word line and the gate terminal of the first MOS transistor.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
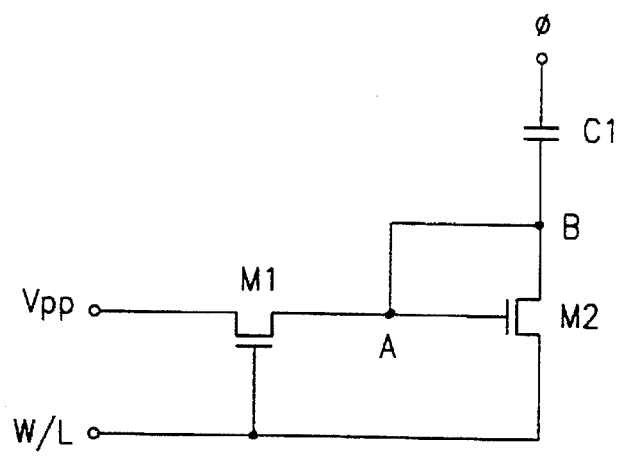
FIG. 1 is a circuit diagram of a conventional charge pump circuit.
Figure 2:
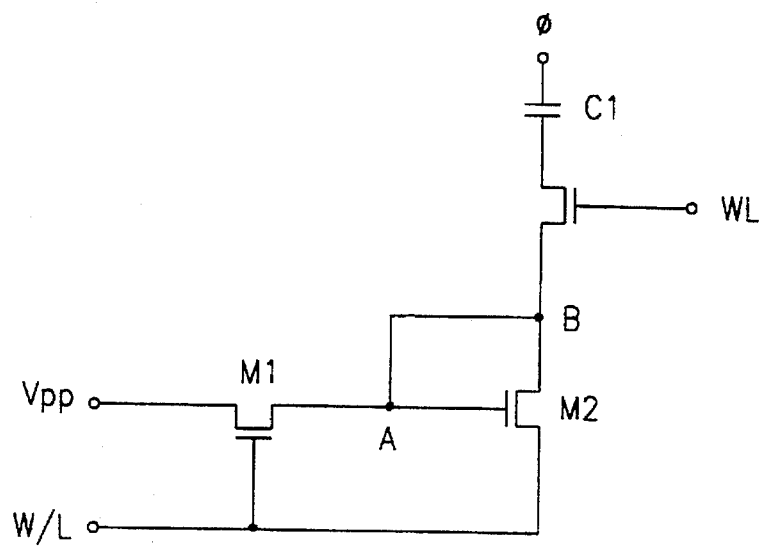
FIG. 2 is a circuit diagram of a charge pump circuit in accordance with the present invention.

Referring to FIG. 2, there is shown a circuit diagram of a charge pump circuit in accordance with the present invention. As shown in this drawing, the charge pump circuit of the present invention further comprises a third MOS transistor M3 connected between the capacitor C1 and the second MOS transistor M2, in addition to the construction in FIG. 1. The third MOS transistor M3 has a drain terminal connected to the one side of the capacitor C1, a source terminal connected to the drain terminal of the second MOS transistor M2 and a gate terminal connected to the word line W/L.

The operation of the charge pump circuit with the above-mentioned construction in accordance with the present invention will hereinafter be described in detail with reference to FIG. 2.

When the supply voltage of 5 V is supplied to the memory device to drive the memory cells therein, it is boosted to 15 V (Vpp) by the pulse generator of the memory device. The boosted voltage from the pulse generator is applied to the drain terminal of the first MOS transistor M1 in the charge pump circuit. The word line voltage of 5 V is applied to the gate terminal of the first MOS transistor M1, thereby causing the first MOS transistor M1 to be turned on. As a result, the word line voltage of 5 V at the gate terminal of the first MOS transistor M1 is transferred to the source terminal thereof, while being dropped by the threshold voltage $V_T$ of the first MOS transistor M1. The resultant voltage (5 V–$V_T$) at the source terminal of the first MOS transistor M1 is transferred to the node A. Because the node A is connected in common to the gate and drain terminals of the second MOS transistor M2, the voltage (5 V–$V_T$) thereof is transferred directly to the node B between the drain terminal of the second MOS transistor M2 and the source terminal of the third MOS transistor M3.

Upon receiving the external clock pulse φ, the capacitor C1 performs the charging operation to generate the voltage ΔV at the rising edge of the clock pulse φ. The voltage ΔV generated from the capacitor C1 is transferred to the node B through the third MOS transistor M3 which is turned on in response to the word line voltage of 5 V at its gate terminal. Thus, the voltage at the node B is boosted to the sum (5 V–$V_T$+ΔV) of the voltage ΔV transferred from the third MOS transistor M3 and the voltage (5 V–$V_T$) transferred from the first MOS transistor M1.

Noticeably, because the third MOS transistor M3 as well as the second MOS transistor M2 has a threshold voltage of substantially zero volts, it transfers the voltage ΔV generated from the capacitor C1 to the node B with substantially no voltage drop. Similarly, the boosted voltage (5 V–$V_T$+ΔV) at the node B is transferred to the source terminal of the second MOS transistor M2 with substantially no voltage drop through the second MOS transistor M2.

The boosted voltage (5 V–$V_T$+ΔV) at the node B is transferred to the gate terminal of the first MOS transistor M1 and the word line W/L through the source terminal of the second MOS transistor M2. As a result, the boosted voltage (5 V–$V_T$+ΔV) appears at the source terminal of the first MOS transistor M1. Namely, the previous voltage (5 V–$V_T$) at the source terminal of the first MOS transistor M1 is boosted by ΔV. The boosted voltage (5 V–$V_T$+ΔV) at the source terminal of the first MOS transistor M1 is again transferred to the nodes A and B. In succession, the voltage ΔV is generated from the capacitor C1 at the rising edge of the subsequent clock pulse φ and then transferred to the node B through the third MOS transistor M3. Thus, the voltage at the node B is boosted to the sum (5 V–$V_T$+2ΔV) of the voltage ΔV transferred from the third MOS transistor M3 and the voltage (5 V–$V_T$+ΔV) transferred from the node A. The resultant voltage (5 V–$V_T$+2ΔV) at the node B is applied to the gate terminal of the first MOS transistor M1 through the source terminal of the second MOS transistor M2.

At that time the voltage at the node A is boosted to 15 V for the last time with the above operation continuously repeated, it is transferred to the word line W/L to drive the memory cells in the memory device. Since the voltage (5 V–$V_T$+ΔV) must be boosted to 15 V, the voltage ΔV generated from the capacitor C1 and the threshold voltage $V_T$ of the first MOS transistor M1 have the following relationship therebetween:

$$V_T < \Delta V$$

As mentioned above, the third MOS transistor M3 transfers the voltage ΔV generated from the capacitor C1 directly with substantially no voltage drop, but avoids excessive current which may flow instantaneously at an initial operating state.

Figure 3:
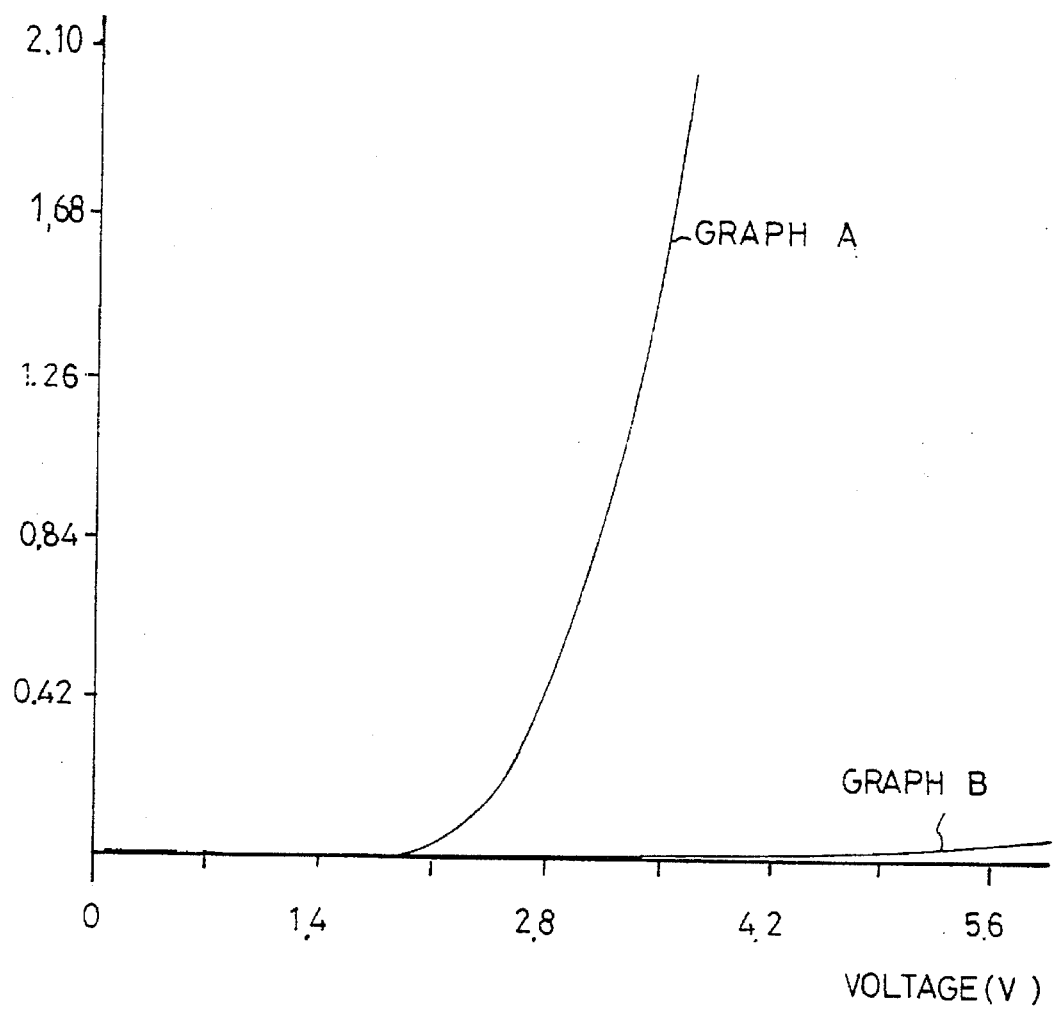
FIG. 3 is a view illustrating comparison of current characteristics in FIGS. 1 and 2 with each other.

FIG. 3 shows graphs A and B illustrating the results which are experimentally obtained with respect to current characteristics in FIGS. 1 and 2 appearing at the initial operating state. In this drawing, the graph A illustrates a current characteristic measured at the node B in FIG. 1 according to voltage increase and the graph B illustrates a current characteristic measured at the node B in FIG. 2 according to voltage increase.

As apparent from the above description, according to the present invention, the charge pump circuit can significantly avoid the excessive current at the initial operating state as compared with the conventional one. Therefore, the charge pump circuit of the present invention has the effect of reducing power consumption and preventing latch-up, to enhance reliability in operation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A charge pump circuit comprising:

a first MOS transistor having a drain terminal for receiving an external voltage and a gate terminal for receiving a word line voltage, said first MOS transistor dropping the word line voltage by a threshold voltage and transferring a dropped voltage through the source terminal thereof;

a capacitor for outputting a desired voltage for each rising edge of clock pulses applied thereto;

a second MOS transistor having a gate terminal for receiving the word line voltage and a drain terminal for receiving the voltage from said capacitor, said second MOS transistor transferring the voltage from said capacitor through a source terminal thereof with substantially no voltage drop; and a third MOS transistor having a gate terminal connected to the source terminal of said first MOS transistor and a drain terminal connected in common to the source terminals of said first and second MOS transistors, said third MOS transistor adding the desired voltage from the source terminal of said second MOS transistor whereby the desired voltage is added to an output voltage from the source terminal of said first MOS transistor and the added voltage at a source terminal of said first MOS transistor is transferred to a word line and the gate terminal of said first MOS transistor.

2. A charge pump circuit of claim 1, wherein said third MOS transistor has a threshold voltage of substantially zero volts.

3. A charge pump circuit coupled to a select line for charging the select line, which selects a storage cell of a memory device, to a predetermined voltage, comprising:

a capacitor; and a plurality of transistors coupled to one another, wherein said plurality of transistors comprises first, second and third transistors, each transistor having first and second electrodes and a control electrode, said first electrode of said first transistor is coupled to said capacitor, said second electrode of said first transistor is coupled to said second and third transistors, and said control electrodes of first and second transistors are coupled to said select line, wherein said first transistor has a threshold voltage of substantially zero volts.

4. The charge pump circuit of claim 3, wherein said first electrode of said second transistor is coupled to to receive a predetermined potential, said second electrode of said second transistor is coupled to said third transistor and said second electrode of said first transistor, and said control electrode of said second transistor is coupled to the select line.

5. The charge pump circuit of claim 3, wherein said first electrode of said third transistor is coupled to said second electrodes of said first and second transistors, said second electrode of said third transistor is coupled to the select line, and said control electrode of said third transistor is coupled to said first electrode of said third transistor.

6. The charge pump circuit of claim 5, wherein said third transistor has a threshold voltage of substantially zero volts.

7. The charge pump circuit of claim 3, wherein said capacitor increases charge accumulation in response to a rising edge of a clock signal.

* * * * *